(12) United States Patent
Lee et al.

(10) Patent No.: US 12,490,386 B2
(45) Date of Patent: Dec. 2, 2025

(54) ELECTRONIC DEVICE

(71) Applicant: Innolux Corporation, Miaoli County (TW)

(72) Inventors: Wen-Hung Lee, Miaoli County (TW); Hsin-Cheng Chen, Miaoli County (TW); Yuan-Cheng Liu, Miaoli County (TW); Meng-Syuan Wu, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 343 days.

(21) Appl. No.: 18/086,678

(22) Filed: Dec. 22, 2022

(65) Prior Publication Data
US 2023/0240018 A1 Jul. 27, 2023

(30) Foreign Application Priority Data

Jan. 21, 2022 (CN) .......................... 202220168020.X (51) Int. Cl.
*H05K 3/30* (2006.01)
*H05K 1/18* (2006.01)

(52) U.S. Cl.
CPC ............... *H05K 3/301* (2013.01); *H05K 1/18* (2013.01); *H05K 2201/10409* (2013.01)

(58) Field of Classification Search
CPC ........ H05K 1/181; H05K 1/182; H05K 1/183; H05K 1/184; H05K 2201/105; H05K 2201/10507; H05K 3/301; H05K 1/18; H05K 1/0271; H05K 2201/10409

USPC .......................... 361/740, 742, 758, 770, 804
See application file for complete search history.

(56) References Cited

U.S. PATENT DOCUMENTS

| | | | | |
|---|---|---|---|---|
| 5,960,526 A | * | 10/1999 | Natali | B23P 17/00 |
| | | | | 312/265.5 |
| 6,542,372 B1 | * | 4/2003 | Paquin | H05K 7/142 |
| | | | | 361/770 |
| 6,695,629 B1 | * | 2/2004 | Mayer | H05K 7/142 |
| | | | | 361/752 |
| 6,771,512 B2 | * | 8/2004 | Paquin | H05K 7/142 |
| | | | | 361/752 |
| 7,385,830 B2 | * | 6/2008 | Liu | H05K 7/142 |
| | | | | 174/138 R |

(Continued)

FOREIGN PATENT DOCUMENTS

TW 200814904 3/2008
TW 201219901 5/2012

*Primary Examiner* — Dameon E Levi
(74) *Attorney, Agent, or Firm* — JCIPRNET (57) ABSTRACT

An electronic device, including a circuit board and a back plate, is provided. The circuit board has a first opening. The back plate includes a bottom portion, a protruding portion, and a column. The protruding portion protrudes from the bottom portion, and the column is located on the protruding portion. In a first direction, the column has a first outer diameter and a second outer diameter. A first width of the first opening is less than the first outer diameter and greater than the second outer diameter to limit the movement of the circuit board. The electronic device of the disclosure limits the movement of the circuit board through the column of the back plate, so as to reduce the number of screws used, thereby achieving the effects of reducing costs and/or reducing man-hours for locking the screws.

18 Claims, 5 Drawing Sheets

(56) References Cited

U.S. PATENT DOCUMENTS

| | | | | |
|---|---|---|---|---|
| 7,983,057 | B2* | 7/2011 | Zheng | H05K 7/142 361/752 |
| 8,149,590 | B2* | 4/2012 | Cho | H05K 7/142 361/742 |
| 10,064,295 | B2* | 8/2018 | Kim | G06F 1/1601 |
| 11,520,177 | B2* | 12/2022 | Lee | G02F 1/13452 |
| 2002/0181219 | A1* | 12/2002 | Paquin | H05K 7/142 361/809 |
| 2006/0114662 | A1* | 6/2006 | Liu | H05K 7/142 361/759 |
| 2014/0009897 | A1* | 1/2014 | Tang | H05K 7/142 361/752 |
| 2021/0382336 | A1* | 12/2021 | Lee | G02F 1/133602 |

\* cited by examiner

ELECTRONIC DEVICE

CROSS-REFERENCE TO RELATED APPLICATION

This application claims the priority benefit of China application serial no. 202220168020.X, filed on Jan. 21, 2022. The entirety of the above-mentioned patent application is hereby incorporated by reference herein and made a part of this specification.

BACKGROUND

Technical Field

The disclosure relates to an electronic device, and in particular to an electronic device that can reduce costs and save manufacturing man-hours.

Description of Related Art

The electronic device transmits a control signal through a circuit board, and the circuit board is fixed on the back plate of the electronic device through screw locking. However, locking screws takes long man-hours and also increases production costs.

SUMMARY

The disclosure provides an electronic device that can reduce the number of screws used to achieve the effects of reducing costs and/or reducing manufacturing man-hours.

According to an embodiment of the disclosure, the electronic device includes a circuit board and a back plate. The circuit board has a first opening. The back plate includes a bottom portion, a protruding portion, and a column. The protruding portion protrudes from the bottom portion, and the column is located on the protruding portion. In a first direction, the column has a first outer diameter and a second outer diameter. In the first direction, the first opening has a first width, and the first width is less than the first outer diameter and greater than the second outer diameter to limit the movement of the circuit board in the first direction and a third direction perpendicular to the first direction, so as to fix the circuit board on the back plate.

Based on the above, in the embodiments of the disclosure, the movement of the circuit board is limited through the column of the back plate to fix the circuit board on the back plate, so as to reduce the number of screws used, so that the electronic device of the disclosure can achieve the effects of reducing costs and/or reducing man-hours for locking the screws.

In order for the features and advantages of the disclosure to be more comprehensible, the following specific embodiments are described in detail in conjunction with the drawings.

BRIEF DESCRIPTION OF THE DRAWINGS

The drawings are included to provide a further understanding of the disclosure, and the drawings are incorporated into the specification and constitute a part of the specification. The drawings illustrate embodiments of the disclosure and serve to explain principles of the disclosure together with the description.

DETAILED DESCRIPTION OF DISCLOSED EMBODIMENTS

The disclosure may be understood by referring to the following detailed description in conjunction with the drawings. It should be noted that in order to facilitate the understanding by the reader and the conciseness of the drawings, multiple drawings in the disclosure only depict a part of an electronic device, and specific elements in the drawings are not drawn according to actual scale. In addition, the number and the size of each element in the drawings are only for illustration and are not intended to limit the scope of the disclosure.

Throughout the specification and the appended claims of the disclosure, certain words are used to refer to specific elements. Persons skilled in the art should understand that electronic device manufacturers may refer to the same elements by different names. The disclosure does not intend to distinguish the elements with the same function but different names.

In the following specification and claims, words such as "containing" and "comprising" are open-ended words, which should be interpreted as "including but not limited to . . . ".

In addition, relative terms, such as "below" or "bottom portion" and "above" or "top portion", may be used in the embodiments to describe the relative relationship of one element to another element of the drawings. It should be understood that if a device in the drawings is turned upside down, elements described as "below" will become elements described as "above".

In some embodiments of the disclosure, terms related to bonding and connection, such as "connection" and "interconnection", unless otherwise defined, may refer to two structures that are directly in contact or may also refer to two structures that are not directly (indirectly) in contact, wherein there is another structure provided between the two structures. Also, the terms related to bonding and connection may also include the case where two structures are both movable or two structures are both fixed. Furthermore, the term "coupling" includes the transfer of energy between two structures by means of direct or indirect electrical connection or the transfer of energy between two separate structures by means of mutual induction.

It should be understood that when an element or a layer is referred to as being "on" or "connected to" another element or layer, the element may be directly on the other element or layer or directly connected to the other element or layer, or there is an intervening element or layer between the two (indirect case). In contrast, when an element is referred to as being "directly on" or "directly connected to" another element or layer, there is no intervening element or layer between the two.

The terms "about", "equal to", "equivalent" or "same", or "substantially" or "roughly" are generally interpreted as within 20% of a given value or range, or interpreted as within 10%, 5%, 3%, 2%, 1%, or 0.5% of the given value or range.

As used herein, the terms "film" and/or "layer" may refer to any continuous or discontinuous structure and material (such as a material deposited by a method disclosed herein). For example, the film and/or the layer may include a two-dimensional material, a three-dimensional material, nanoparticles, or even a part of or a complete molecular layer, a part of or a complete atomic layer, or atomic and/or molecular clusters. The film or the layer may contain a material or a layer having pinholes, which may be at least partially continuous.

Although the terms first, second, third . . . may be used to describe various constituent elements, the constituent elements are not limited by the terms. The terms are only used to distinguish a single constituent element from other constituent elements in the specification. The same terms may not be used in the claims, but replaced by first, second, third . . . according to the order in which the elements are declared in the claims. Therefore, in the following specification, a first constituent element may be a second constituent element in the claims.

Unless otherwise defined, all terms (including technical and scientific terms) used herein have the same meaning as commonly understood by persons skilled in the art to which the disclosure belongs. It should be understood that the terms, such as those defined in commonly used dictionaries, should be interpreted as having meanings consistent with the prior art and the background or context of the disclosure, and should be interpreted in an idealized or overly formal manner, unless specifically defined herein.

It should be noted that in the following embodiments, the technical features of several different embodiments may be replaced, reorganized, and mixed to complete other embodiments without departing from the spirit of the disclosure.

An electronic device of the disclosure may include a display device, an antenna device, a sensing device, a light emitting device, or a splicing device, but not limited thereto. The electronic device may include a bendable or flexible electronic device. The electronic device may include an electronic element. The electronic device includes, for example, a liquid crystal layer or a light emitting diode (LED). The electronic element may include a passive element and an active element, such as a capacitor, a resistor, an inductor, a variable capacitor, a filter, a diode, a transistor, a sensor, micro-electro mechanical systems (MEMS), and a liquid crystal chip, but not limited thereto. The diode may include a light emitting diode or a photodiode. The light emitting diode may include, for example, an organic light emitting diodes (OLED), a mini LED, a micro LED, a quantum dot LED, fluorescence, phosphor, other suitable materials, or a combination of the above, but not limited thereto. The sensor may include, for example, a capacitive sensor, an optical sensor, an electromagnetic sensor, a fingerprint sensor (FPS), a touch sensor, an antenna, a pen sensor, etc., but not limited thereto.

Reference will now be made in detail to the exemplary embodiments of the disclosure, examples of which are illustrated in the drawings. Wherever possible, the same reference numerals are used in the drawings and the description to refer to the same or similar parts.

Figure 1A:
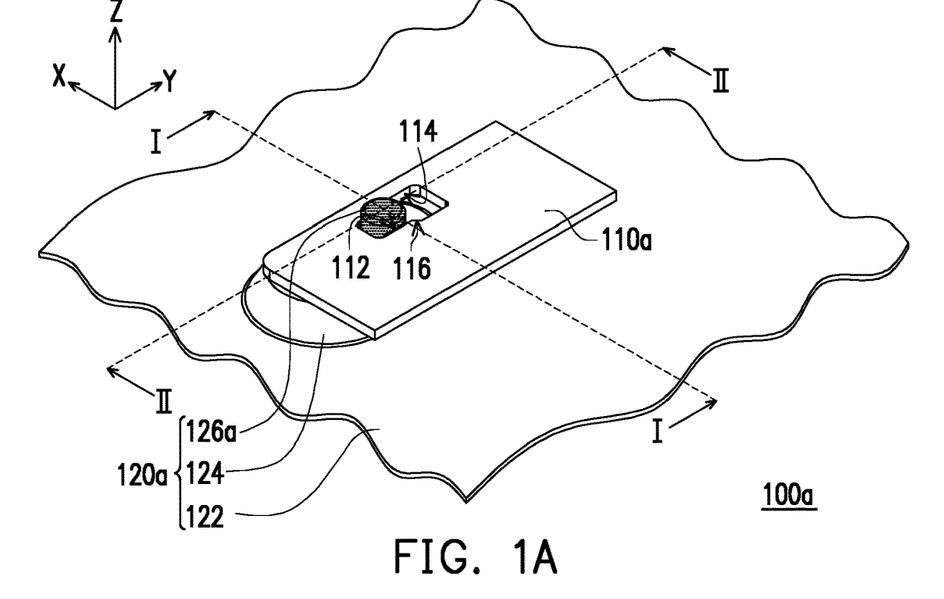
FIG. 1A is a partial perspective schematic view of an electronic device according to an embodiment of the disclosure.
Figure 1B:
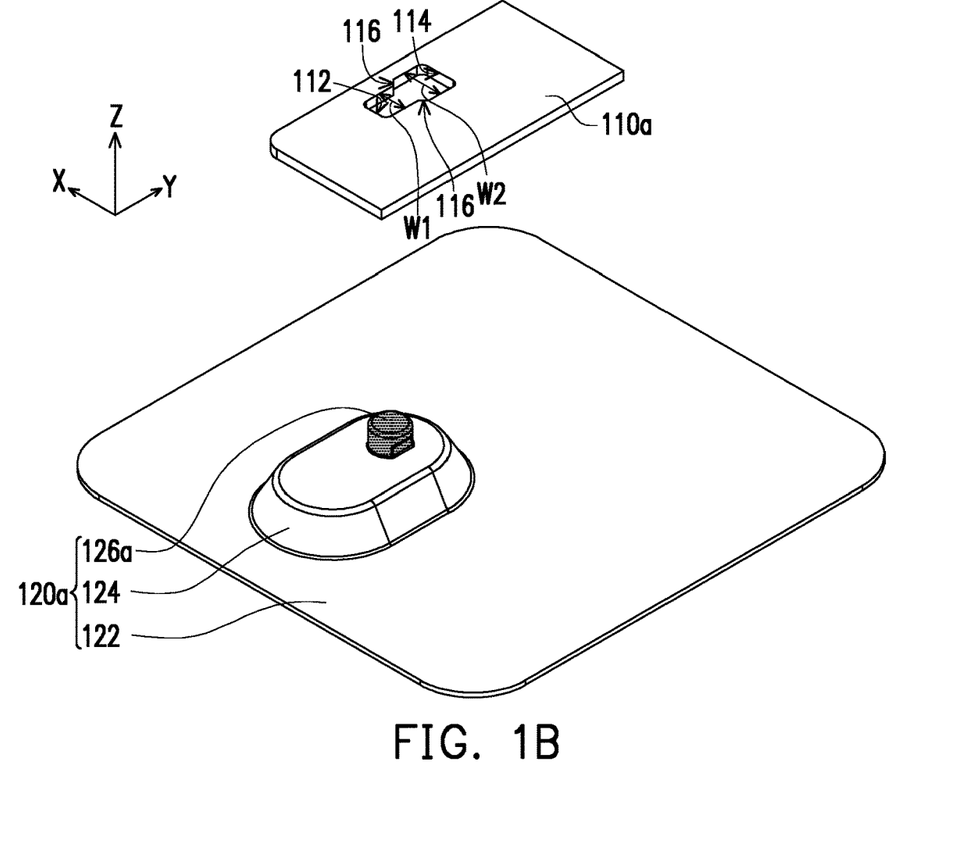
FIG. 1B is a perspective exploded schematic view of the electronic device of FIG. 1A.
Figure 2A:
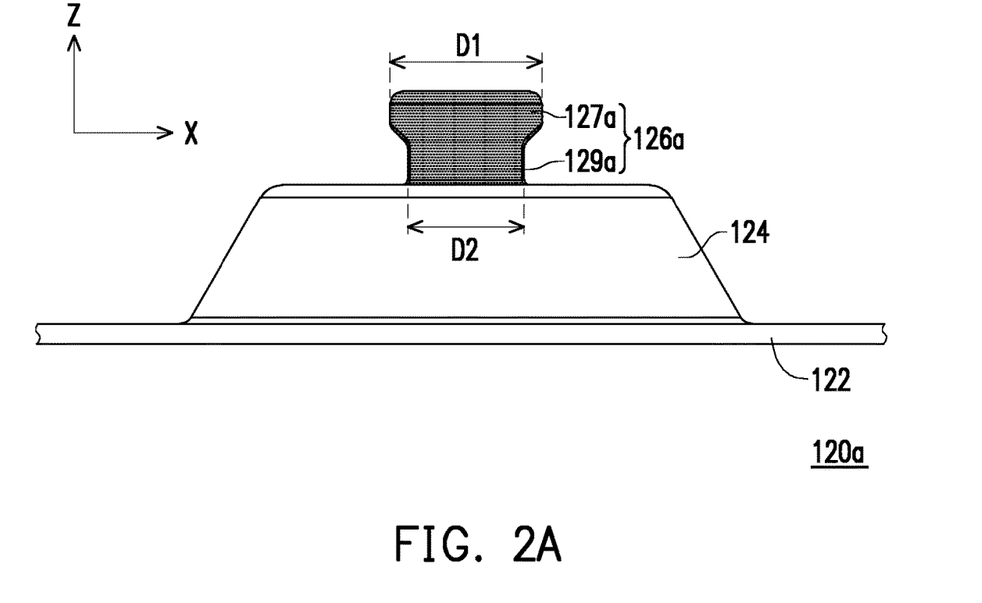
FIG. 2A is a side schematic view of a back plate of the electronic device of FIG. 1A from a viewing angle.
Figure 2B:
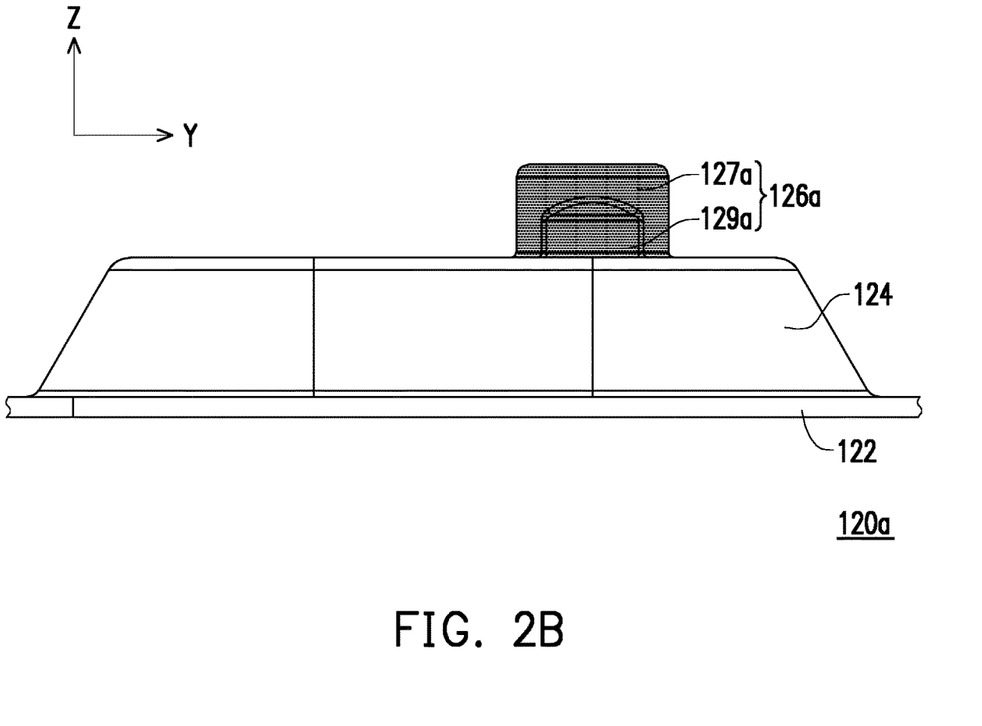
FIG. 2B is a side schematic view of the back plate of the electronic device of FIG. 1A from another viewing angle.
Figure 3A:
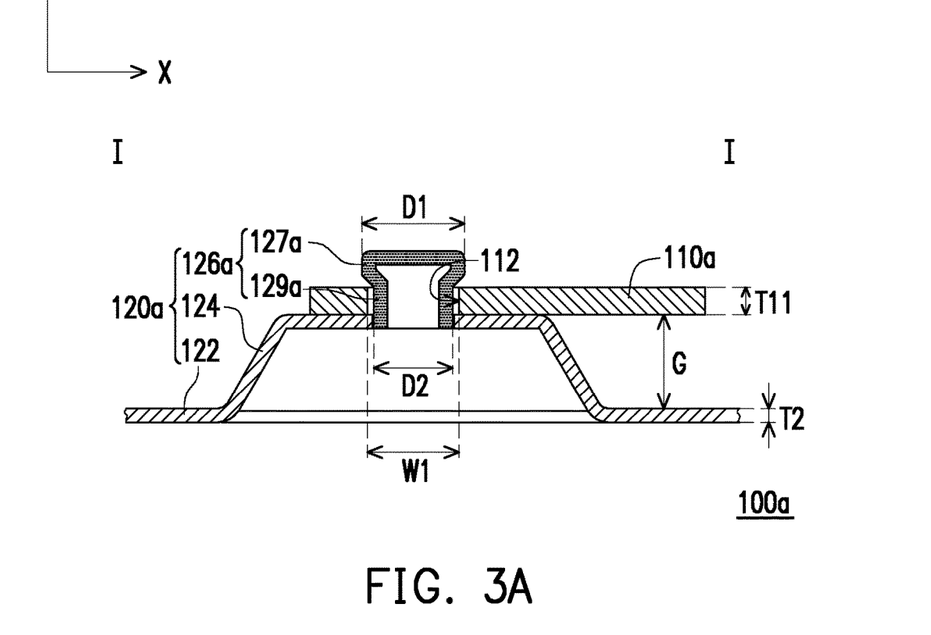
FIG. 3A is a cross-sectional schematic view along a line I-I of FIG. 1A.
Figure 3B:
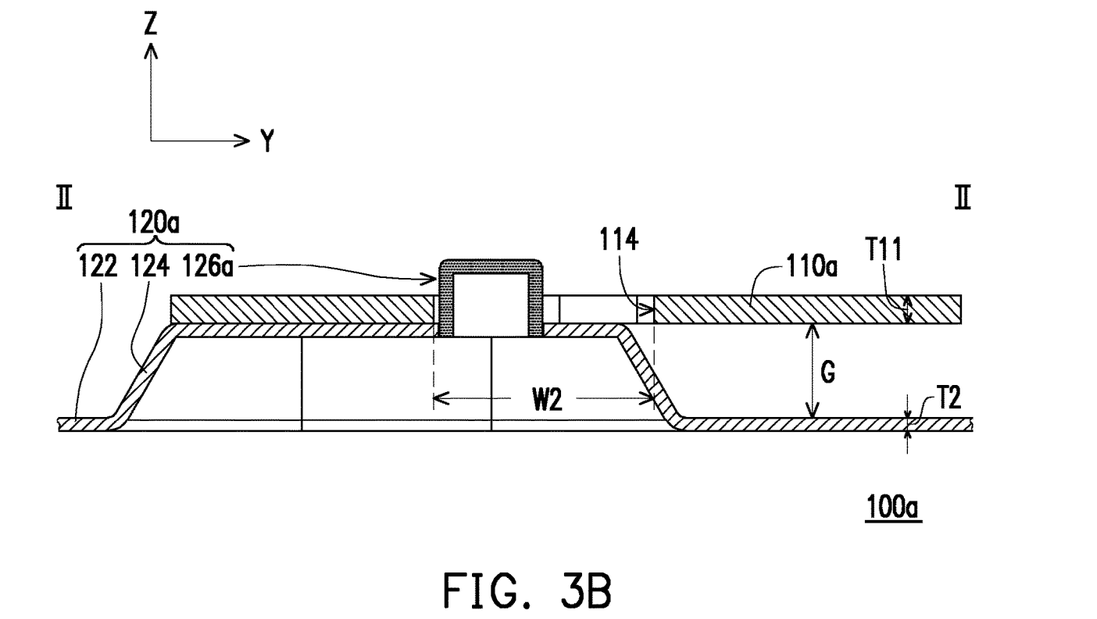
FIG. 3B is a cross-sectional schematic view along a line II-II of FIG. 1A.

FIG. 1A is a partial perspective schematic view of an electronic device according to an embodiment of the disclosure. FIG. 1B is a perspective exploded schematic view of the electronic device of FIG. 1A. FIG. 2A is a side schematic view of a back plate of the electronic device of FIG. 1A from a viewing angle. FIG. 2B is a side schematic view of the back plate of the electronic device of FIG. 1A from another viewing angle. FIG. 3A is a cross-sectional schematic view along a line I-I of FIG. 1A. FIG. 3B is a cross-sectional schematic view along a line II-II of FIG. 1A.

Please refer to FIG. 1A and FIG. 1B at the same time. In the embodiment, an electronic device 100a includes a circuit board 110a and a back plate 120a. Here, the electronic device 100a is, for example, a display device, such as a television, the back plate 120a is, for example, a metal back plate, and the circuit board 110a is, for example, a system on a chip board, a power board, a control board, or a motherboard, but not limited thereto.

Specifically, in the embodiment, the circuit board 110a has a first opening 112 with a first width W1 along a direction, such as a first direction X. As shown in FIG. 1A and FIG. 1B, the circuit board 110a of the embodiment also has a second opening 114 connected to the first opening 112, wherein the second opening 114 has a second width W2 along the first direction X, and the second width W2 is greater than the first width W1. Furthermore, the circuit board 110a also has a guiding portion 116, wherein the guiding portion 116 connects the first opening 112 and the second opening 114, and the guiding portion 116 has, for example, a C angle design, which can facilitate the assembler by increasing the guiding direction when assembling the circuit board 110a, thereby reducing assembly man-hours.

Furthermore, the back plate 120a of the embodiment includes a bottom portion 122, a protruding portion 124, and a column 126a. The protruding portion 124 protrudes from the bottom portion 122, and the column 126a is located on the protruding portion 124. As shown in FIG. 2A and FIG. 2B, the column 126a of the back plate 120a of the embodiment may be a disassembly structure, that is, the bottom portion 122 and the protruding portion 124 are an integrally formed structure, and the column 126a and the protruding portion 124 are independent components. In other words, the column 126a may be fixed on the protruding portion 124 through locking, adhesion, or other suitable manners, but not limited thereto. In addition, the material used for the bottom portion 122 and the protruding portion 124 of the back plate 120a may be different from the material used for the column 126a, but not limited thereto.

Further, please refer to FIG. 2A and FIG. 2B again. The column 126a of the embodiment includes a first portion 127a and a second portion 129a connected to each other, wherein the column 126a has, for example, an approximately cylindrical appearance, but not limited thereto. The second portion 129a is, for example, concave on two opposite side surfaces in the first direction X to have a second outer diameter D2, while the first portion 127a may remain as it is, so that the first portion 127a has a first outer diameter D1 greater than the second outer diameter D2. The second portion 129a is located between the first portion 127a and the protruding portion 124.

Next, please refer to FIG. 1A, FIG. 3A, and FIG. 3B at the same time. In the embodiment, in the first direction X, the first width W1 of the first opening 112 of the circuit board 110a is less than the first outer diameter D1 of the first portion 127a of the column 126a, and the first width W1 of the first opening 112 of the circuit board 110a is greater than the second outer diameter D2 of the second portion 129a of the column 126a, that is, D1>W1>D2, so that the circuit board 110a may be blocked by the first portion 127a to prevent the circuit board 110a from being ejected in a third direction Z perpendicular to the first direction X. In addition, in the case where the back plate 120a does not move, the circuit board 110a may be pushed and installed in a second direction Y perpendicular to the first direction X, so that the column 126a of the back plate 120a may be guided to enter the first opening 112 from the second opening 114 by the guiding portion 116 of the circuit board 110a, such that the second portion 129a of the column 126a is confined in the first opening 112 to limit the movement of the circuit board 110a in the first direction X and the third direction Z, so as to fix the circuit board 110a on the back plate 120a.

At this time, the edge of the first opening 112 of the circuit board 110a limits the displacement of the circuit board 110a in the first direction X. The first portion 127 of the column 126a is located on the circuit board 110a. The circuit board 110a may directly contact the protruding portion 124, and a spacing G between the circuit board 110a and the bottom portion 122 is equal to the height of the protruding portion 124. Here, the height of the protruding portion 124 may be designed to be adjusted to meet the relevant requirements of the product safety distance. If the height of the protruding portion 124 is lower than the safety distance, an insulating material (for example, mylar) may be attached to the protruding portion 124, but not limited thereto. In addition, a thickness T11 of the circuit board 110a is, for example, between 1 mm and 1.6 mm, and a thickness T2 of the back plate 120a is, for example, between 0.5 mm and 0.8 mm, but not limited thereto.

In short, in the embodiment of the disclosure, through changing the structure of the back plate 120a, the column 126a of the back plate 120a may limit the movement of the circuit board 110a in the first direction X and the third direction Z to fix the circuit board 110a on the back plate 120a. In other words, in the embodiment of the disclosure, the purpose of fixing between the circuit board 110a and the back plate 120a may be achieved through a mechanism buckle. In this way, the number of screws used can be reduced, so that the electronic device 100a of the disclosure can achieve the effects of reducing costs and/or reducing man-hours for locking the screws.

It should be noted here that the following embodiments continue to use the reference numerals and some content of the above embodiment, wherein the same reference numerals are used to represent the same or similar elements, and the description of the same technical content is omitted. For the description of the omitted part, reference may be made to the above embodiment, which will not be repeated in the following embodiments.

Figure 4A:
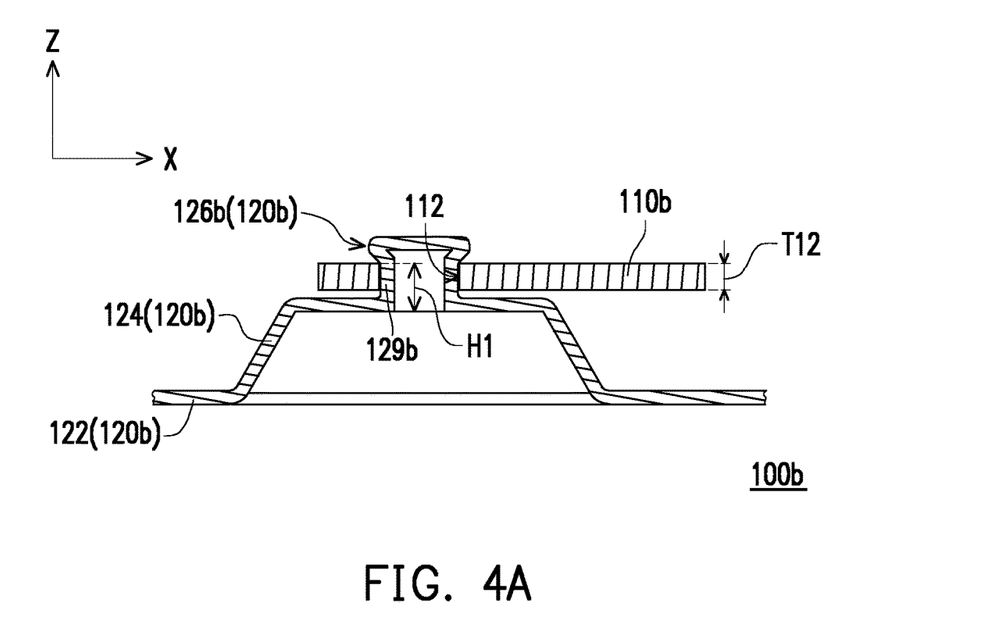
FIG. 4A is a cross-sectional schematic view of an electronic device in a first direction according to another embodiment of the disclosure.
Figure 4B:
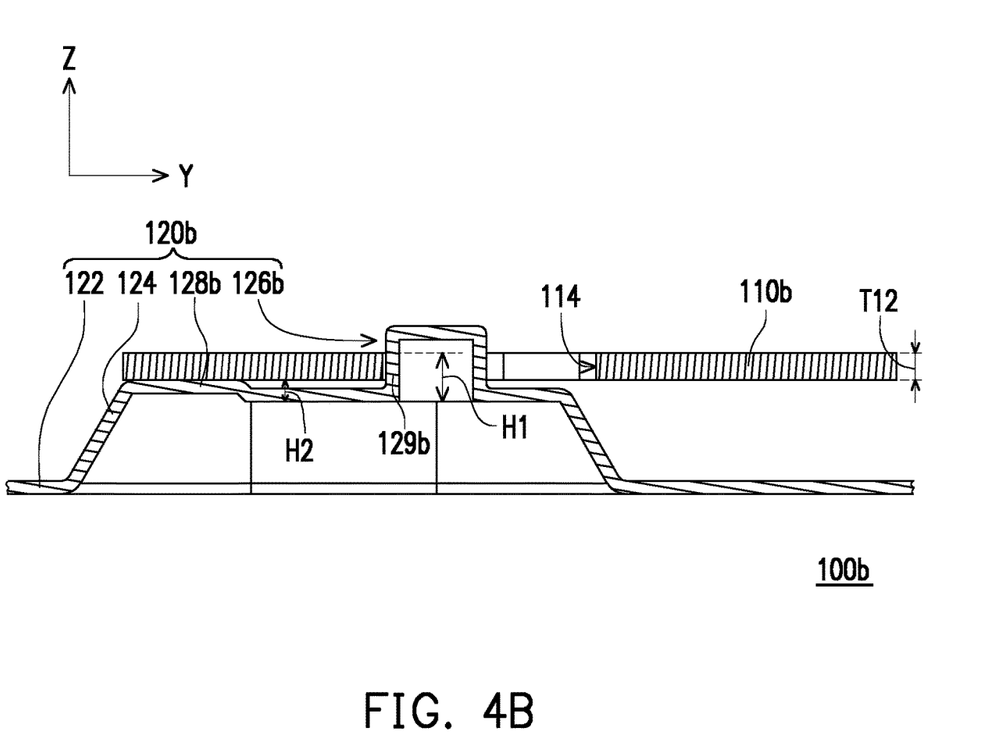
FIG. 4B is a cross-sectional schematic view of the electronic device of FIG. 4A in a second direction.

FIG. 4A is a cross-sectional schematic view of an electronic device in a first direction according to another embodiment of the disclosure. FIG. 4B is a cross-sectional schematic view of the electronic device of FIG. 4A in a second direction. Please refer to FIG. 3A, FIG. 3B, FIG. 4A, and FIG. 4B at the same time. An electronic device 100b is similar to the electronic device 100a of FIG. 3A, and the difference between the two is that in this embodiment, the bottom portion 122, the protruding portion 124, and a column 126b are an integrally formed structure. In other words, a back plate 120b is made of a single metal material and belongs to a one-piece structure. Furthermore, in the embodiment, the back plate 120b further includes a bump 128b, wherein the bump 128b is located on the protruding portion 124, and a first height H1 of a second portion 129b of the column 126b along the third direction Z may be greater than or equal to a thickness T12 of the circuit board 110b plus a second height H2 of the bump 128b along the third direction Z. Here, the purpose of the bump 128b is not only to enhance the tightness of the circuit board 110b in the third direction Z after assembly, but also to change the height thereof to match the circuit board 110b with different thickness without changing the first height H1 of the second portion 129b of the column 126b.

Figure 5:
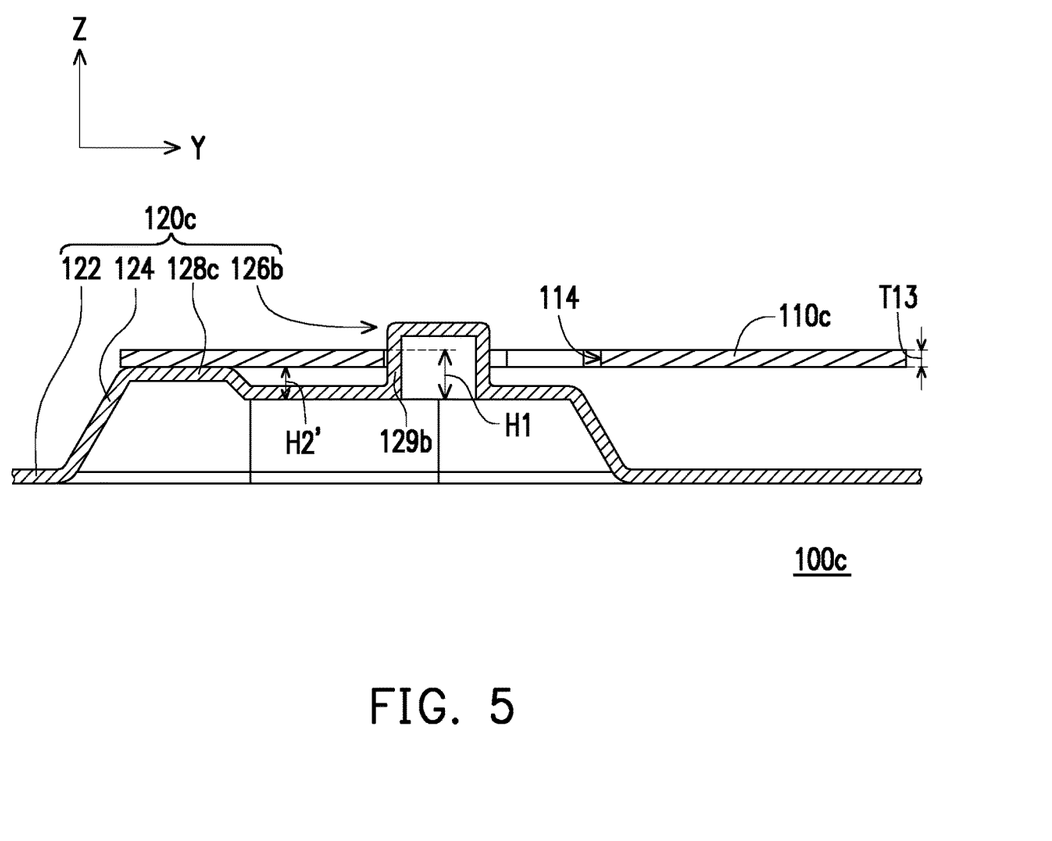
FIG. 5 is a cross-sectional schematic view of an electronic device in a second direction according to another embodiment of the disclosure.

FIG. 5 is a cross-sectional schematic view of an electronic device in a second direction Y according to another embodiment of the disclosure. Please refer to FIG. 4B and FIG. 5 at the same time. An electronic device 100c is similar to the electronic device 100b of FIG. 4B, and the difference between the two is that in this embodiment, a thickness T13 of a circuit board 110c is less than the thickness T12 of the circuit board 110b, so through changing the height of a bump 128c of a back plate 120c, a second height H2' of the bump 128c plus the thickness T13 of the circuit board 110c may be equal to the first height H1 of the second portion 129b of the column 126b. Therefore, there is no need to change the first height H1 of the second portion 129b of the column 126b, so that the column 126b may be shared by circuit boards with different thicknesses.

In short, in the embodiment, the bump 128b and the bump 128c with different heights may be matched with the circuit board 110b and the circuit board 110c with different thicknesses, thereby achieving the purpose of sharing the column 126b. In other words, the second portion 129b of the column 126b of the embodiment may be used with the circuit board 110b and the circuit board 110c with different thicknesses without changing the height.

It is worth mentioning that the embodiments of the disclosure do not limit the positions of the bump 128b and the bump 128c. Although as shown in FIG. 4B and FIG. 5, the bump 128b and the bump 128c are disposed at positions closer to the first opening 112 of the circuit board 110b and the circuit board 110c, but in other unshown embodiments, the bump 128b and the bump 128c may also be disposed at positions closer to the second opening 114 of the circuit board 110b and the circuit board 110c, which still belongs to the protection scope of the disclosure.

In summary, in the embodiments of the disclosure, the movement of the circuit board is limited through the column of the back plate to fix the circuit board on the back plate, so as to reduce the number of screws used, so that the electronic device of the disclosure can achieve the effects of reducing costs and/or reducing man-hours for locking the screws.

Finally, it should be noted that the above embodiments are only used to illustrate, but not to limit, the technical solutions of the disclosure. Although the disclosure has been described in detail with reference to the above embodiments, persons skilled in the art should understand that the technical solutions described in the above embodiments can still be modified or some or all of the technical features thereof can be equivalently replaced. However, the modifications or replacements do not cause the essence of the corresponding technical solutions to deviate from the scope of the technical solutions of the embodiments of the disclosure.

What is claimed is:

1. An electronic device, comprising:
   a circuit board, having a first opening; and
   a back plate, comprising a bottom portion, a protruding portion, and a column, wherein the protruding portion protrudes from the bottom portion, and the column is located on the protruding portion, wherein in a first direction, the column has a first outer diameter and a second outer diameter, the first opening has a first width, and the first width is less than the first outer diameter and greater than the second outer diameter;
   wherein the column comprises a first portion and a second portion connected to each other, the first portion has the first outer diameter, the second portion has the second portion outer diameter, and the second portion is located between the first portion and the protruding portion; and
   wherein the back plate further comprises a bump located on the protruding portion, and a first height of the second portion is equal to a thickness of the circuit board plus a second height of the bump.

2. The electronic device according to claim 1, wherein the circuit board directly contacts the protruding portion.

3. The electronic device according to claim 1, wherein the protruding portion and the column are an integrally formed structure.

4. The electronic device according to claim 1, wherein the column and the protruding portion are independent components.

5. The electronic device according to claim 1, wherein the circuit board further has a second opening connected to the first opening, wherein in the first direction, the second opening has a second width, and the second width is greater than the first width.

6. The electronic device according to claim 5, wherein the second width of the second opening is greater than the first outer diameter.

7. The electronic device according to claim 5, wherein the circuit board further has a guiding portion connecting the first opening and the second opening.

8. The electronic device according to claim 7, wherein the guiding portion comprises a C angle.

9. The electronic device according to claim 1, wherein a thickness of the circuit board is between 1 mm and 1.6 mm.

10. The electronic device according to claim 1, wherein the circuit board comprises a system on a chip board, a power board, a control board, or a motherboard.

11. The electronic device according to claim 1, wherein a material of the bottom portion and the protruding portion of the back plate is different from a material of the column.

12. The electronic device according to claim 1, wherein the column has an approximately cylindrical appearance.

13. The electronic device according to claim 1, wherein the first outer diameter is greater than the second outer diameter.

14. The electronic device according to claim 1, wherein an edge of the first opening of the circuit board limits a displacement of the circuit board in the first direction.

15. The electronic device according to claim 1, wherein the circuit board directly contacts the protruding portion, and a spacing between the circuit board and the bottom portion is equal to a height of the protruding portion.

16. The electronic device according to claim 1, wherein the bottom portion, the protruding portion, and the column are an integrally formed structure.

17. The electronic device according to claim 16, wherein the back plate is made of a single metal material.

18. The electronic device according to claim 1, wherein a thickness of the back plate is between 0.5 mm and 0.8 mm.

* * * * *